United States Patent
Yu

(10) Patent No.: US 6,815,821 B2
(45) Date of Patent: Nov. 9, 2004

(54) METHOD OF FABRICATING SEAL-RING STRUCTURE WITH ESD PROTECTION

(75) Inventor: Ta-Lee Yu, Hsinchu Hsien (TW)

(73) Assignee: Taiwan Semiconductor Manufacturing Co., Ltd., Hsin-chu (TW)

(*) Notice: Subject to any disclaimer, the term of this patent is extended or adjusted under 35 U.S.C. 154(b) by 0 days.

(21) Appl. No.: 10/217,650

(22) Filed: Aug. 14, 2002

(65) Prior Publication Data

US 2003/0071280 A1 Apr. 17, 2003

(30) Foreign Application Priority Data

Aug. 20, 2001 (TW) .................................. 90120357 A

(51) Int. Cl.[7] .................................................. H01L 23/485
(52) U.S. Cl. ........................ 257/758; 257/620; 257/629
(58) Field of Search ................................ 257/620, 629, 257/758, 200, 342, 355, 678

(56) References Cited

U.S. PATENT DOCUMENTS

| 5,391,920 A | * | 2/1995 | Tsuji ........................... 257/758 |
| 5,998,245 A | * | 12/1999 | Yu ............................... 438/140 |
| 6,537,849 B1 | * | 3/2003 | Tsai et al. .................... 438/106 |

* cited by examiner

Primary Examiner—David Nelms
Assistant Examiner—Dao H. Nguyen
(74) Attorney, Agent, or Firm—Birch, Stewart, Kolasch & Birch, LLP

(57) ABSTRACT

A seal ring structure having an electrostatic discharge protection function, suitable for a conductive first-type substrate which has a bias provided by a second power source. The new seal ring scheme including a conductive second-type doped diffusion region located on the first-type substrate; and a metal conductive structure, comprising at least a metal layer and a connection conductor, wherein the connection conductor is connected to the conductive second-type doped diffusion region and to a bias provided by a first power source and to the metal layer.

4 Claims, 5 Drawing Sheets

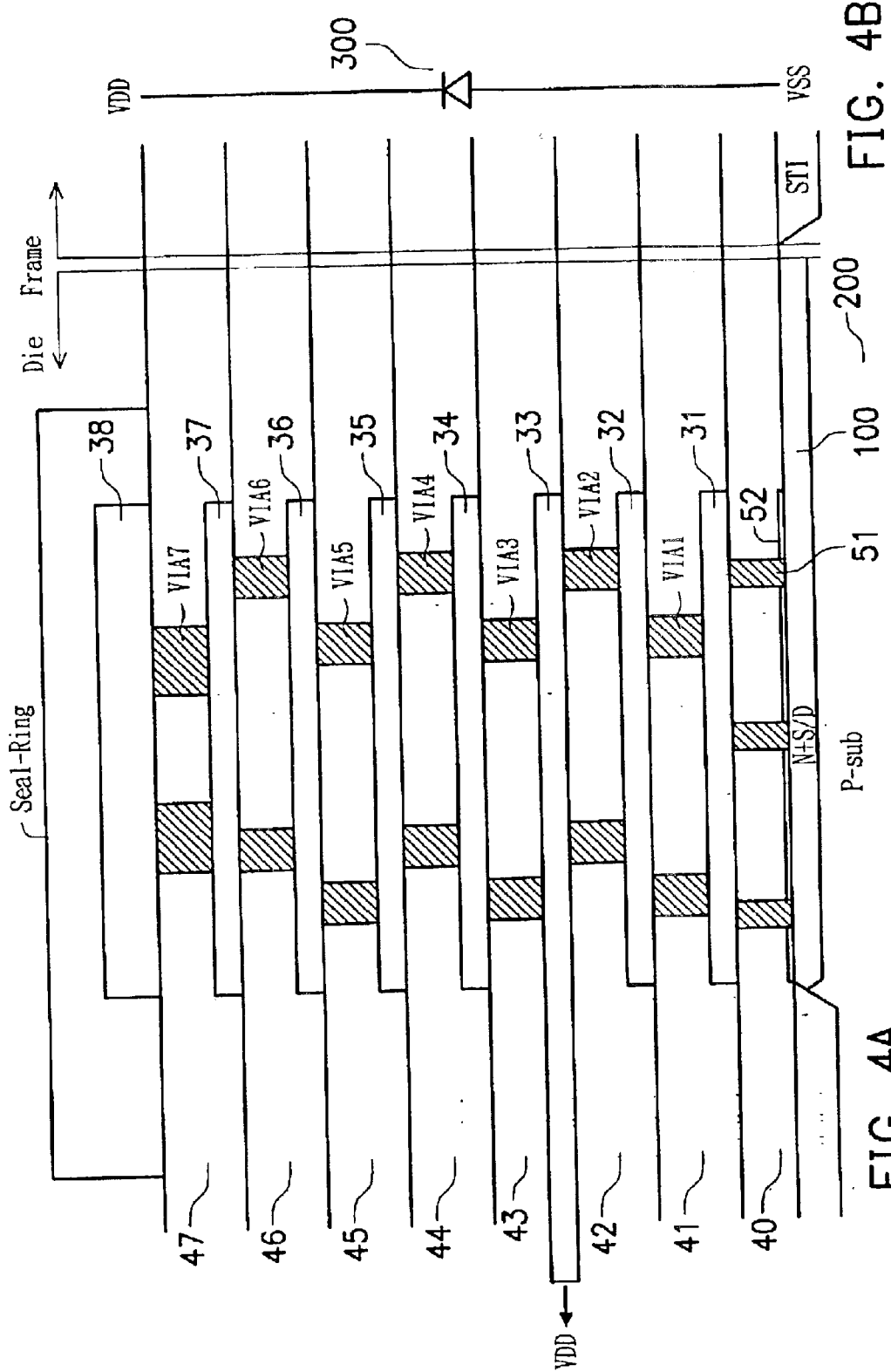

METHOD OF FABRICATING SEAL-RING STRUCTURE WITH ESD PROTECTION

BACKGROUND OF THE INVENTION

1. Field of the Invention

The invention relates to a semiconductor integrated circuit (IC), and in particular to a seal ring structure which can prevent electrostatic discharge damage in a semiconductor integrated circuit.

2. Description of Prior Art

Currently, an electrostatic discharge design is quite important in all semiconductor IC designs and fabrications. Since the size of electronic devices has decreased markedly and the density of ICs is continuously increasing, devices having tiny structures do not possess electrostatic discharge robustness. Therefore, how to prevent electrostatic discharge damage or provide sufficient capability to discharge an electrostatic charge is a major task in improving the reliability and yield of such products.

According to the concept of conventional electrostatic discharge design, a circuit that functions to discharge a large amount of electrostatic current and to stop high potential is disposed between an IC and the environment (for example, on a bonding pad). In addition, the area of the above-mentioned circuitry is maximized so as to allow a large amount of electrostatic current to flow, such that the electrostatic current can be discharged outside of the IC, thereby protecting the internal circuitry of the IC from damage.

Based on the design principle mentioned above, a conventional electrostatic discharge protection circuit connected to a bonding pad is fabricated by an additional doped diffusion region formed on a substrate. FIG. 1 illustrates a structure of a conventional electrostatic discharge protection circuit, while FIG. 2 depicts its equivalent circuit. In FIG. 1, a bonding pad 10 is connected to a doped diffusion region 25 on a substrate 20. In FIG. 2, a diode 27 providing an electrostatic discharge function is formed by the doped diffusion region 25 and by a well region 22. Since the diode breaks down upon the application of a high bias voltage to release a large amount of electrostatic current, it can greatly enhance the electrostatic protection ability.

However, the electrostatic discharge protection circuit is disposed on a region where no devices are formed on the substrate, thus occupying excessive space and not readily enlarging the efficient area of the protection circuit for discharging the electrostatic current. Hence, in the past, parasitic circuit(s) or SCR(s) have been adopted in an electrostatic discharge protection circuit to achieve a best performance in a given area.

Furthermore, a seal ring structure is a very important part in the back-end of a semiconductor process. The seal ring is a stress protection structure around an IC and can protect the internal circuit inside a chip from damage during a chip scribe line region treatment.

FIG. 3 illustrates a cross section diagram of a conventional seal ring, comprising metal layers 31–38, dielectric layers 40–47, via 7 and 51, silicide 52, P-type doped diffusion region, and a P-type substrate 200. The metal layer 31 is electrically connected to the P-type doped diffusion region 102. The metal layers 31–38 are electrically connected, and a Ohmic contact is between the metal layer 31 and the P-type doped diffusion 102, such that the potential of the metal layers 31–38 and the P-type substrate have the same voltage.

Moreover, the seal ring only provides a mechanical protection function. The conventional seal ring does not provide an electrostatic discharge protection function.

SUMMARY OF THE INVENTION

In view of the above, the present invention provides a seal ring structure having an electrostatic discharge protection function occupying a small amount space and efficiently discharging an electrostatic force.

Furthermore, the seal ring structure having an electrostatic discharge protection function according to the invention not only efficiently discharges the electrostatic force between a high power source and low power source in an IC, but also acts as a noise filter for the IC during a normal operation.

The seal ring structure having an electrostatic discharge protection function according to the invention is fabricated on a conductive first type substrate having a bias voltage provided by a second power source. The seal ring structure includes a conductive second type doped diffusion region on the conductive first type substrate, and a conductive metal structure, which comprises at least a metal layer and a connection conductor, wherein the connection conductor is connected to the conductive second-type doped diffusion region and to a bias provided by a first power source and to the metal layer.

A method of fabricating the seal ring of the present invention comprises the following steps: providing a conductive first type substrate, forming a conductive second-type doped diffusion region located on the conductive first-type substrate, and forming a metal conductive structure, comprising at least a metal layer and a connection conductor, wherein the connection conductor is connected to the conductive second-type doped diffusion region and to a bias provided by a first power source and to the metal layer.

BRIEF DESCRIPTION OF THE DRAWINGS

The present invention will become more fully understood from the detailed description given herein below and the accompanying drawings, which are provided for illustration of preferred embodiments only and should not be construed as limiting the scope of the present invention, and wherein:

FIG. 4A is a cross-sectional view illustrating a seal ring structure having an electrostatic discharge protection function according to a first embodiment of the invention;

FIG. 4B is a schematic view illustrating a seal ring structure having an electrostatic discharge protection function according to according to a first embodiment of the invention;

DETAILED DESCRIPTION OF THE INVENTION

Figure 1:
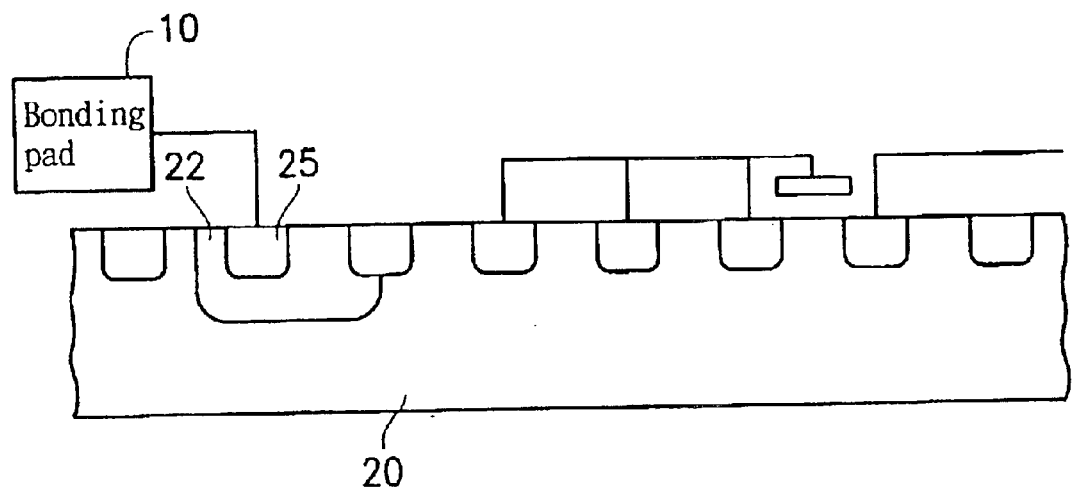
FIG. 1 is a cross-sectional view illustrating an electrostatic discharge protection circuit according to the prior art.
Figure 2:
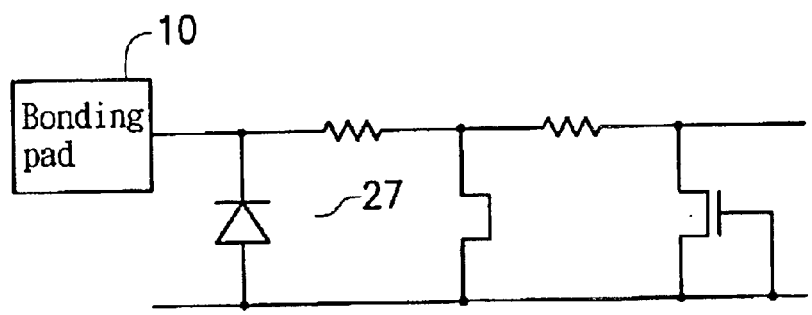
FIG. 2 is an equivalent circuit diagram of FIG. 1.
Figure 3:
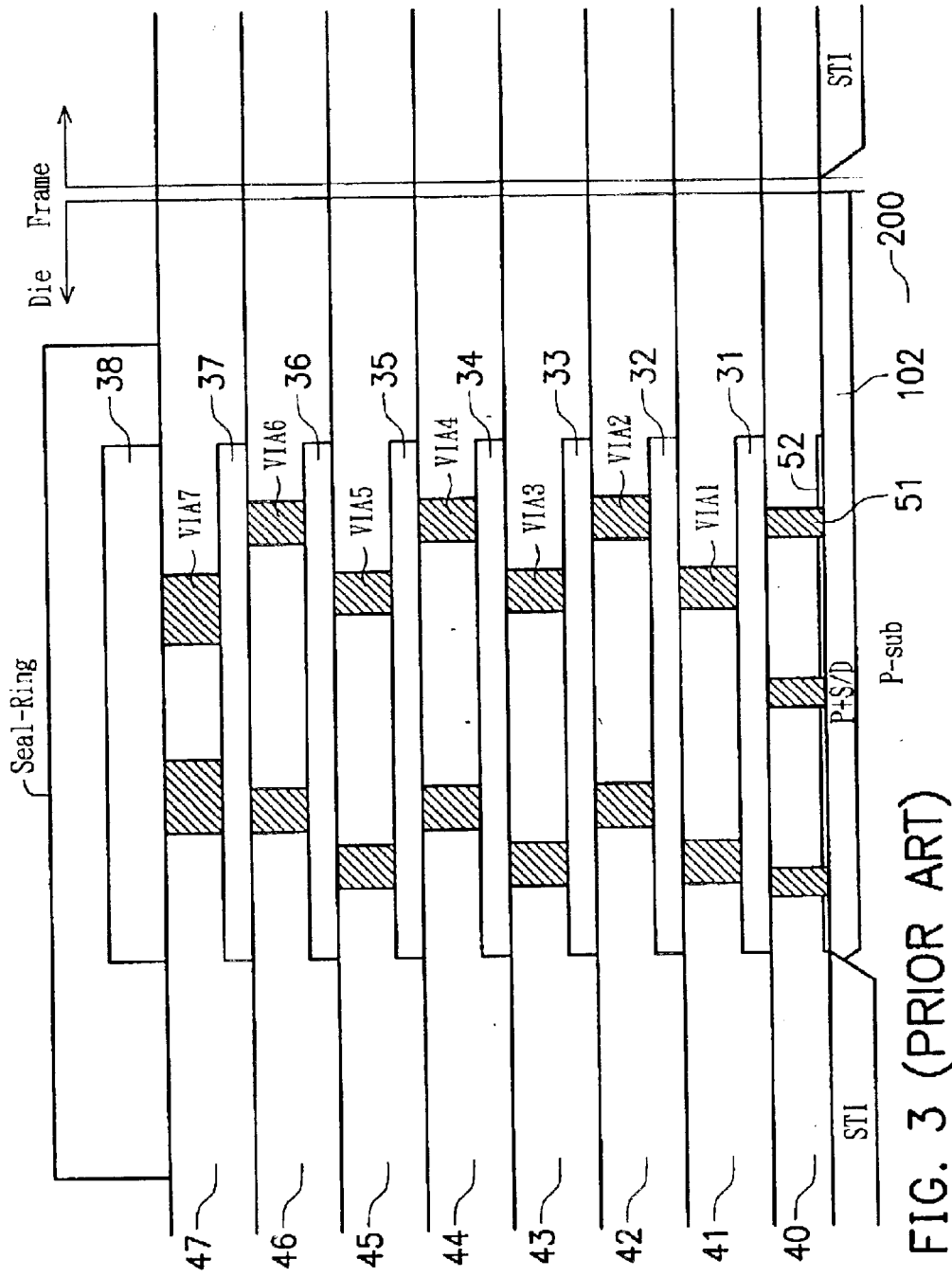
FIG. 3 is a cross-sectional view showing a seal ring structure according to the prior art.

In order to utilize the wide area occupied by the seal ring structure in an IC, a diode (or a capacity) is disposed between a metal layer and a substrate in the seal ring. Moreover, the metal layer in the seal ring is connected to a power source different from that on the substrate, so that an electrostatic force existing between different power sources can be discharged via the seal ring structure, thereby providing electrostatic discharge protection.

FIG. 4A is a cross section view illustrating a seal ring structure according to a first embodiment of the present invention. In FIG. 4A, the seal ring structure includes metal layers 31–38, dielectric layers 40–47, via 7 and 51, which are connection conductors between metal layers, and N-type doped diffusion region 100, located on a P-type substrate 200.

The seal structure is constructed on a P-type substrate 200. A N-type doped diffusion region 100 is formed on the P-type substrate 200. The metal layers include metal layers 31–38, which are connected electrically. The dielectric layers include layers 40–47. The metal layer 33 is connected electrically to voltage source VDD. The metal layer 31 is connected electrically to the N-type doped diffusion 100. The P-type substrate 200 is electrically connected to the voltage source VSS. Therefore, a diode is disposed between the voltage source VDD and VSS. The equivalent diode 300 is shown in FIG. 4B. The diode 300 formed under the large-area seal ring structure can discharge a large amount of electrostatic current, thereby enhancing the protection function.

Figures 5A, 5B:
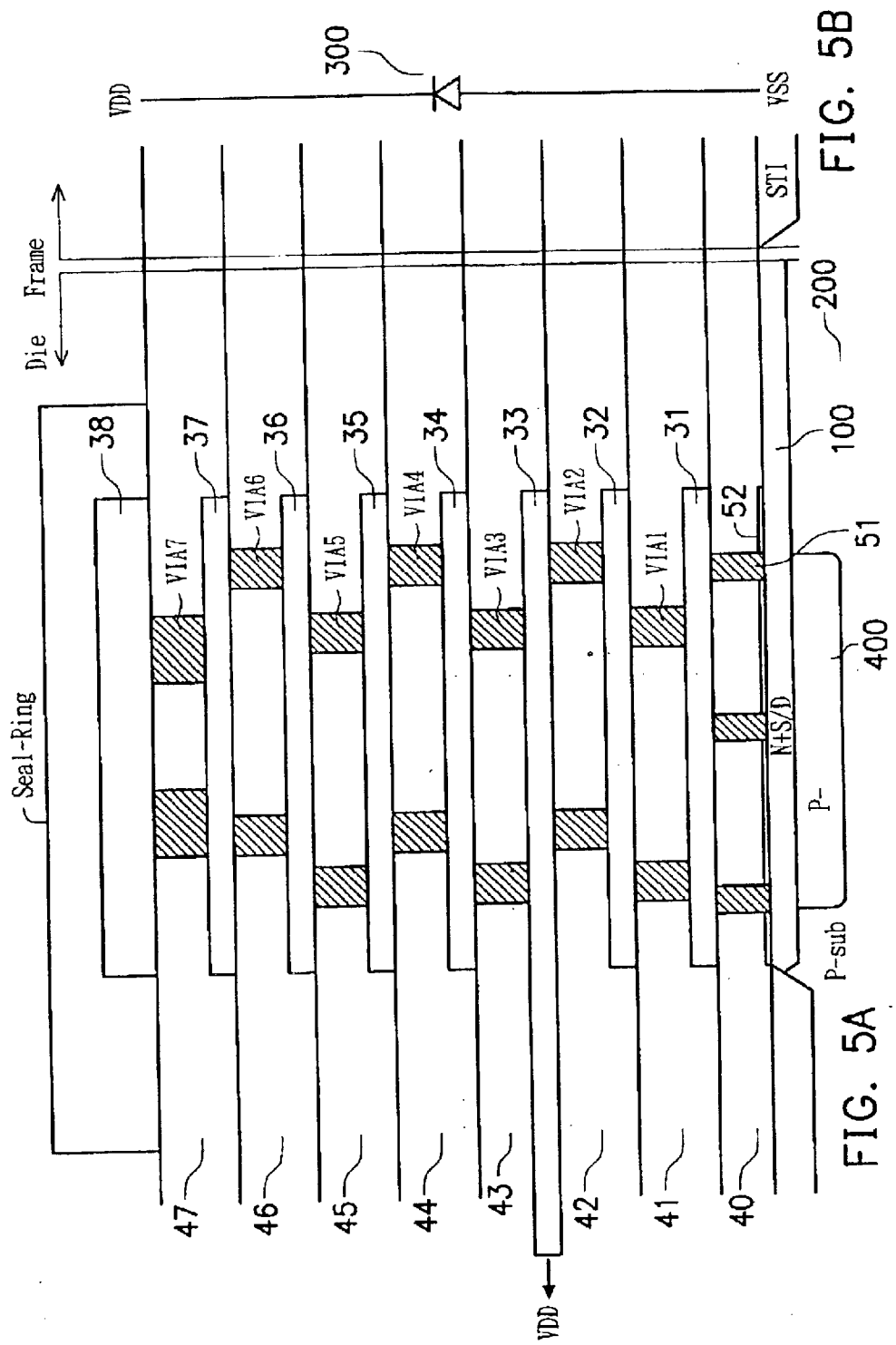
FIG. 5A is a cross-sectional view illustrating a seal ring structure having an electrostatic discharge protection function according to a second embodiment of the invention.
FIG. 5B is a schematic view illustrating a seal ring structure having an electrostatic discharge protection function according to a second embodiment of to the invention.

FIG. 5A is a cross-sectional view illustrating a seal ring structure having an electrostatic discharge protection function according to a second embodiment of the invention. As shown in FIG. 5A, a P-type lightly doped diffusion region 400 is formed under the N-type doped diffusion region 100 for reducing the breakdown voltage of the junction between the N-type doped diffusion region 100 and the P-type substrate 200. FIG. 5B is a schematic view illustrating a seal ring structure having an electrostatic discharge protection function according to the second embodiment of the invention.

Figures 6A, 6B:
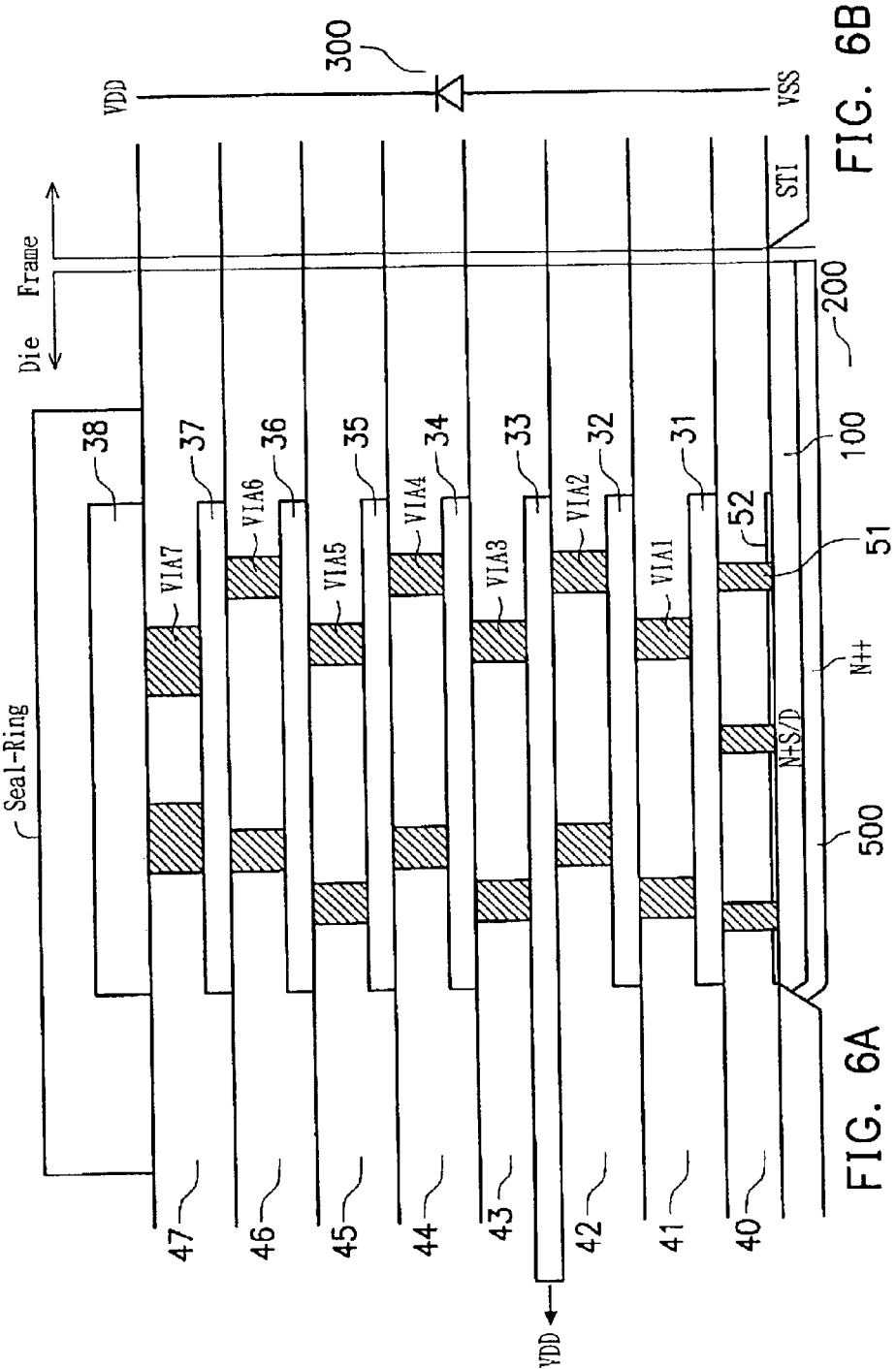
FIG. 6A is a cross-sectional view illustrating a seal ring structure having an electrostatic discharge protection function according to a third embodiment of the invention.
FIG. 6B is a schematic view illustrating a seal ring structure having an electrostatic discharge protection function according to a third embodiment of the invention.

FIG. 6A is a cross-sectional view illustrating a seal ring structure having an electrostatic discharge protection function according to a third embodiment of the invention. As shown in FIG. 6A, a N-type heavily doped diffusion region 500 is formed under the N-type doped diffusion region 100 for reducing the breakdown voltage of the junction between the N-type doped diffusion region 100 and the P-type substrate 200. FIG. 6B is a schematic view illustrating a seal ring structure having an electrostatic discharge protection function according to the second embodiment of to the invention.

The advantages of the seal ring structure having an electrostatic discharge function according to the invention are as follows:

1. An electrostatic force can be discharged via an electrostatic discharge path provided by the wide area of a seal ring in order to protect an IC from damage.

2. A capacity between different power sources shields an IC efficiently from interference caused by power source noise, such that IC operational efficiency can be enhanced.

3. An electrostatic discharge protection circuit formed by a seal ring structure reduces inefficient use of space on an IC.

4. An additional secondary conventional electrostatic discharge protection circuit further protects the IC from damage caused by an electrostatic potential.

Although the invention has been disclosed in terms of a preferred embodiment, the disclosure is not intended to limit the invention. Those knowledgeable in the art can make modifications within the scope and spirit of the invention which is determined by the claims below.

What is claimed is:

1. A seal ring structure having an electrostatic discharge protection function, suitable for a conductive first-type substrate which has a bias provided by a second power source, comprising:

a conductive second-type doped diffusion region located on the first-type substrate; and a metal conductive structure, comprising at least a metal layer and a plurality of connection conductors, wherein the metal layer is above the connection conductors, the connection conductors are connected to the conductive second-type doped diffusion region and to a bias provided by a first power source and to the metal layer.

2. The seal ring structure as claimed in claim 1, wherein the second-type doped diffusion region is N-type, and the conductive first-type substrate is P-type.

3. The seal ring structure as claimed in claim 1, further comprising:

a dielectric layer for isolating the metal conductive structure from the second-type doped diffusion region.

4. A seal ring structure having an electrostatic discharge protection function, suitable for a conductive first-type substrate which has a bias provided by a second power source, comprising:

a conductive second-type doped diffusion region located on the first-type substrate;

a plurality of metal layers located on the conductive second-type doped diffusion region sequentially;

a plurality of connection conductors connecting the metal layers one by one to the conductive second-type doped diffusion region; and a plurality of dielectric layers respectively isolating each metal layer from any other metal layer and all metal layers from the conductive second-type doped diffusion region;

wherein a bias from a first power source is received by any metal layer, and the bias is provided to the conductive second-type doped diffusion region through the connection conductors.

* * * * *